United States Patent
Liskow

(10) Patent No.: US 10,462,915 B2
(45) Date of Patent: Oct. 29, 2019

(54) ELECTRONIC MODULE AND METHOD FOR PRODUCING AN ELECTRONIC MODULE HAVING A FLUID-TIGHT HOUSING

(71) Applicant: Robert Bosch GmbH, Stuttgart (DE)

(72) Inventor: Uwe Liskow, Asperg (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 15/779,254

(22) PCT Filed: Oct. 19, 2016

(86) PCT No.: PCT/EP2016/075035
§ 371 (c)(1),
(2) Date: May 25, 2018

(87) PCT Pub. No.: WO2017/089031
PCT Pub. Date: Jun. 1, 2017

(65) Prior Publication Data
US 2018/0352666 A1 Dec. 6, 2018

(30) Foreign Application Priority Data

Nov. 27, 2015 (DE) ........................ 10 2015 223 550

(51) Int. Cl.
*H05K 5/00* (2006.01)
*H05K 5/06* (2006.01)
(Continued)

(52) U.S. Cl.
CPC ........... *H05K 5/0082* (2013.01); *H05K 1/144* (2013.01); *H05K 3/28* (2013.01); *H05K 3/368* (2013.01);
(Continued)

(58) Field of Classification Search
CPC .... H05K 5/0082; H05K 5/0069; H05K 3/368; H05K 3/28; H05K 1/144; H05K 5/062;
(Continued)

(56) References Cited

U.S. PATENT DOCUMENTS 6,144,571 A * 11/2000 Sasaki .................. H01L 25/162
257/687
6,442,027 B2 * 8/2002 Sanada .................. H05K 1/144
29/832
(Continued)

FOREIGN PATENT DOCUMENTS

DE          39 42 392 A1    6/1990
DE    10 2011 088 969 A1    6/2013
(Continued)

OTHER PUBLICATIONS

International Search Report corresponding to PCT Application No. PCT/EP2016/075035, dated Jan. 2, 1017 (German and English language document) (7 pages).

*Primary Examiner* — Abhishek M Rathod
(74) *Attorney, Agent, or Firm* — Maginot, Moore & Beck LLP

(57) ABSTRACT

An electronic module includes a first circuit board. The first circuit board has electronic components, spacers, a cover plate, and a casting compound. The spacers are positioned so as to rest at least in corner regions of the first circuit board. The cover plate is positioned on the spacers. The casting compound acts as an end face and seals a gap formed by the spacers between the first circuit board and the cover plate, so as to form a housing for the electronic components, which are positioned therein. The casting compound secures the cover plate to the first circuit board via positive engagement. A coefficient of linear thermal expansion of the casting (Continued)

compound corresponds substantially to a coefficient of linear thermal expansion of the circuit board and of the cover plate.

20 Claims, 15 Drawing Sheets

(51) Int. Cl.
    *H05K 1/14*     (2006.01)
    *H05K 3/28*     (2006.01)
    *H05K 3/36*     (2006.01)

(52) U.S. Cl.
    CPC ............. *H05K 5/0069* (2013.01); *H05K 5/06* (2013.01); *H05K 5/062* (2013.01); *H05K 2201/047* (2013.01)

(58) Field of Classification Search
    CPC .... H05K 5/06; H05K 2201/047; H05K 3/284; H05K 5/065; H01L 2924/181
    See application file for complete search history.

(56) References Cited

U.S. PATENT DOCUMENTS

| | | | | |
|---|---|---|---|---|
| 7,919,157 | B2 * | 4/2011 | Cooper | E06B 3/6612 |
| | | | | 428/34 |
| 8,472,197 | B2 * | 6/2013 | Higashibata | B60R 16/0239 |
| | | | | 165/185 |
| 9,947,891 | B2 * | 4/2018 | Qian | H01L 51/56 |
| 2007/0158021 | A1 * | 7/2007 | Sawai | H01J 5/20 |
| | | | | 156/285 |
| 2008/0266821 | A1 * | 10/2008 | Wetzel | H01L 21/50 |
| | | | | 361/757 |
| 2009/0086431 | A1 * | 4/2009 | Sakamoto | H05K 7/20009 |
| | | | | 361/695 |
| 2015/0368527 | A1 * | 12/2015 | Ikoma | E04B 1/80 |
| | | | | 523/218 |
| 2016/0116606 | A1 * | 4/2016 | Itaya | G01T 1/2023 |
| | | | | 250/366 |

FOREIGN PATENT DOCUMENTS

| | | |
|---|---|---|
| DE | 10 2011 088 970 A1 | 6/2013 |
| DE | 10 2013 215 227 A1 | 2/2015 |
| DE | 10 2013 215 246 A1 | 2/2015 |
| DE | 10 2014 205 385 A1 | 9/2015 |

* cited by examiner

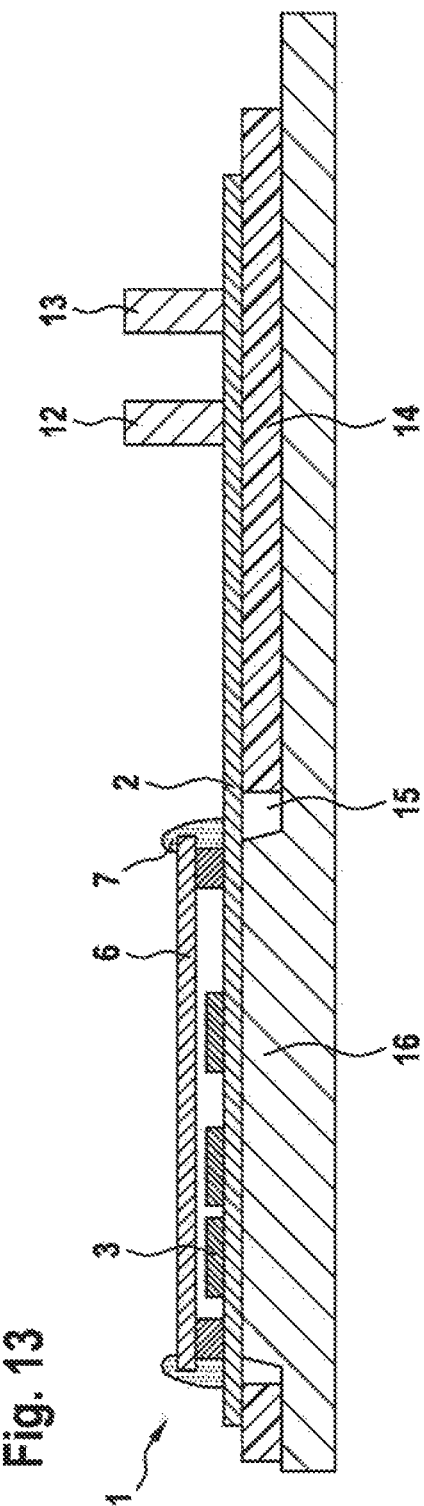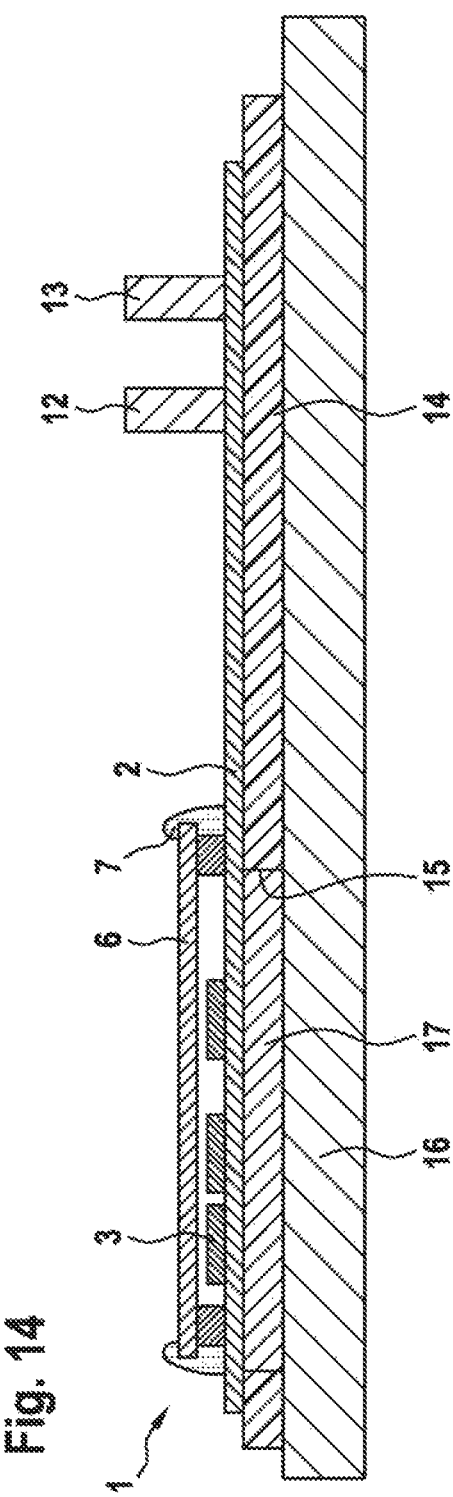

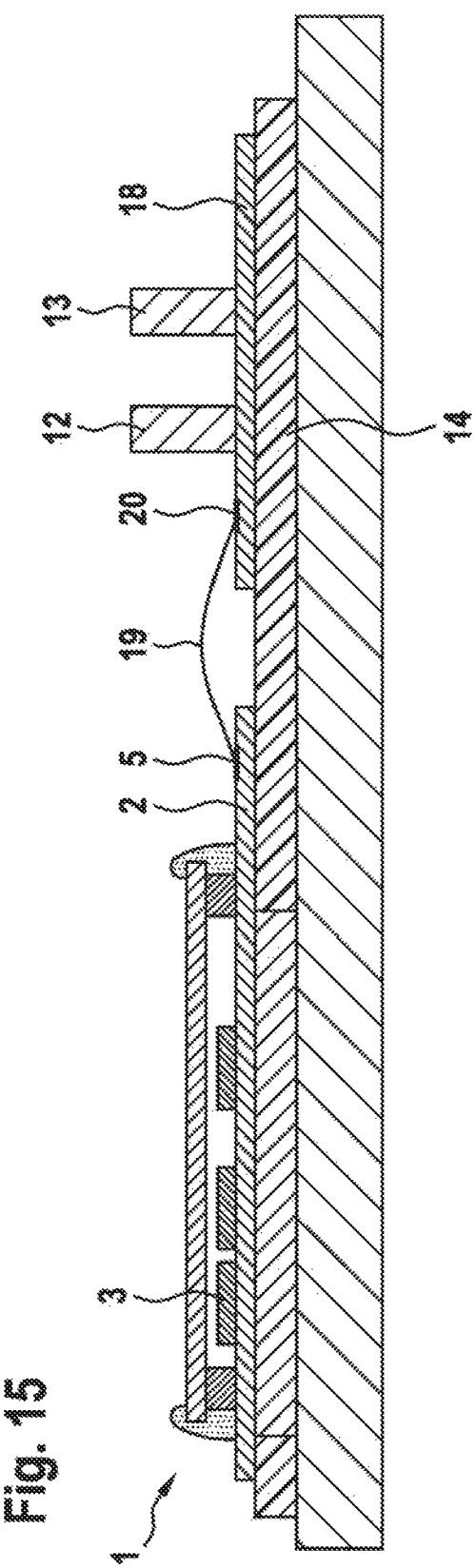
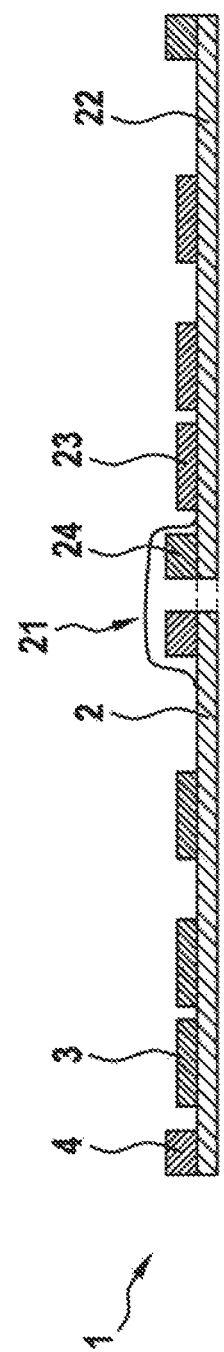

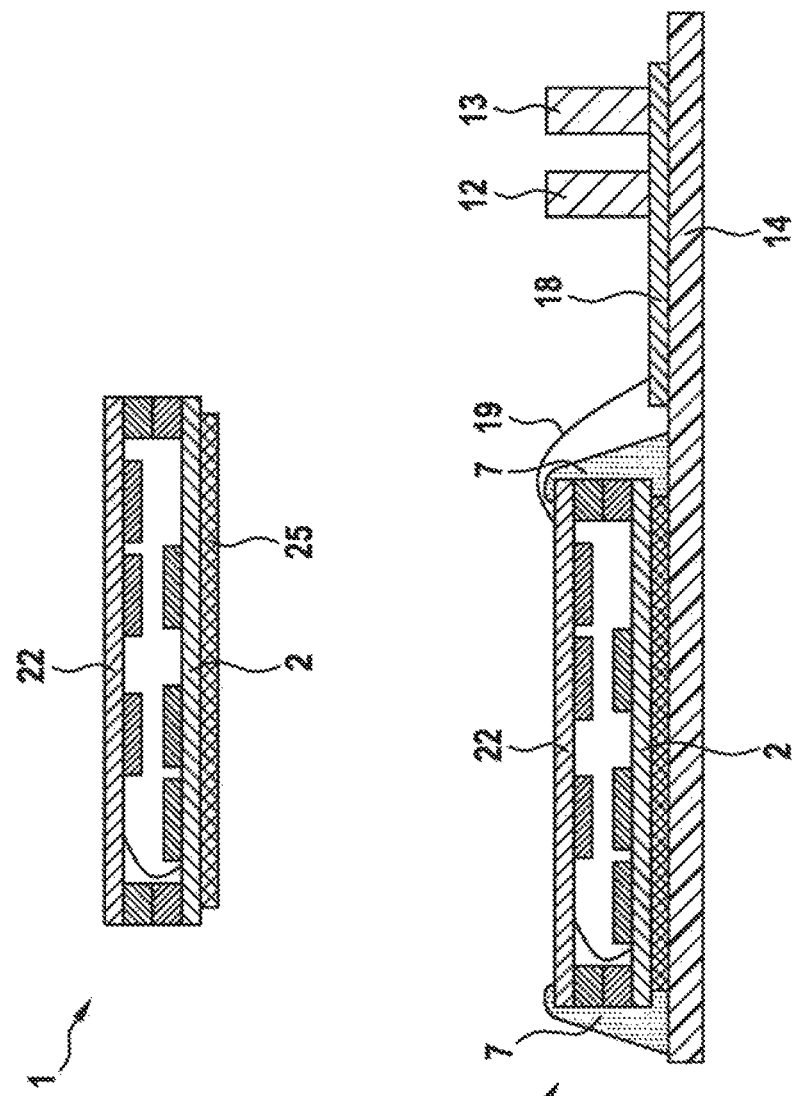

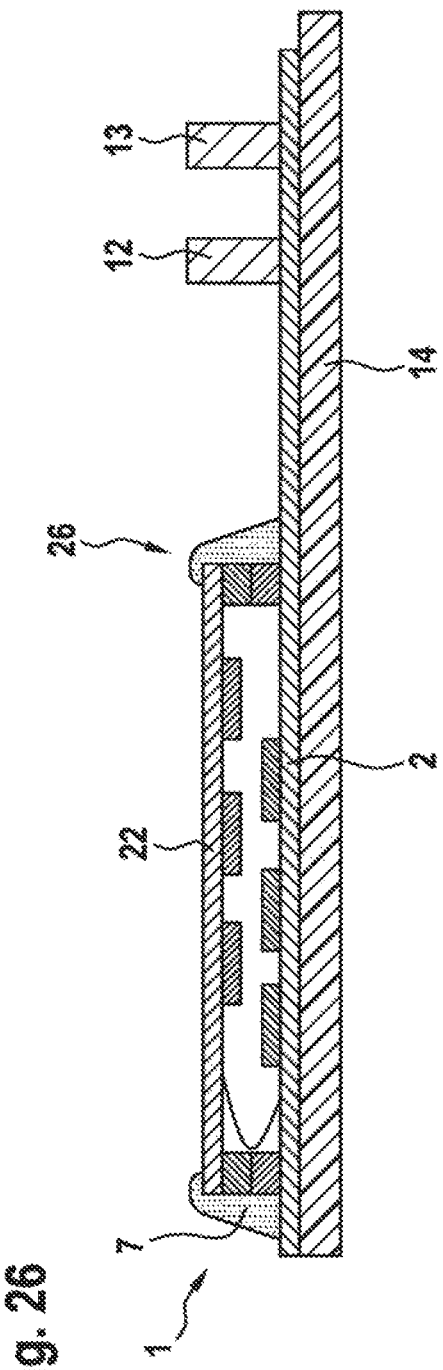
Fig. 25
Fig. 26

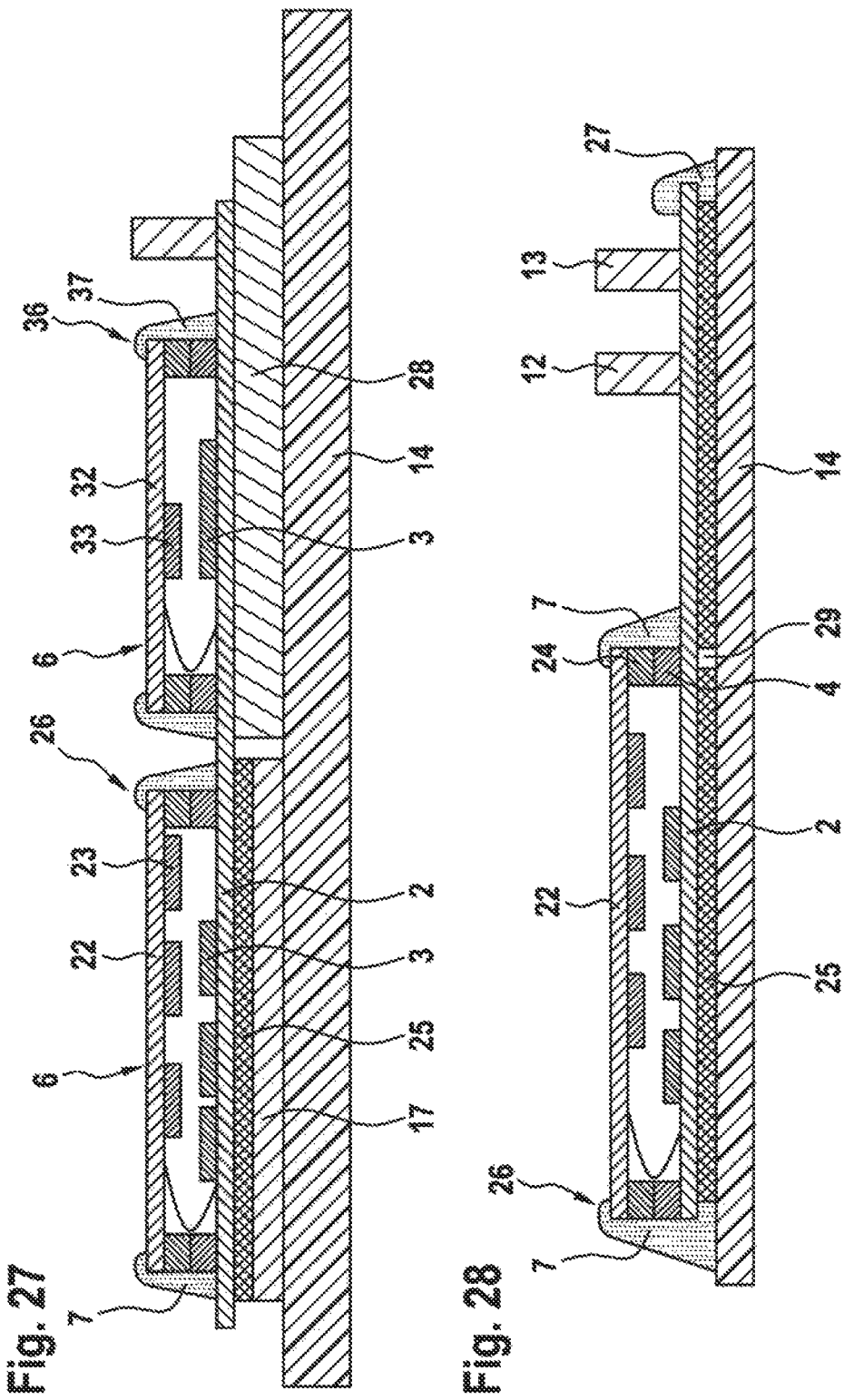

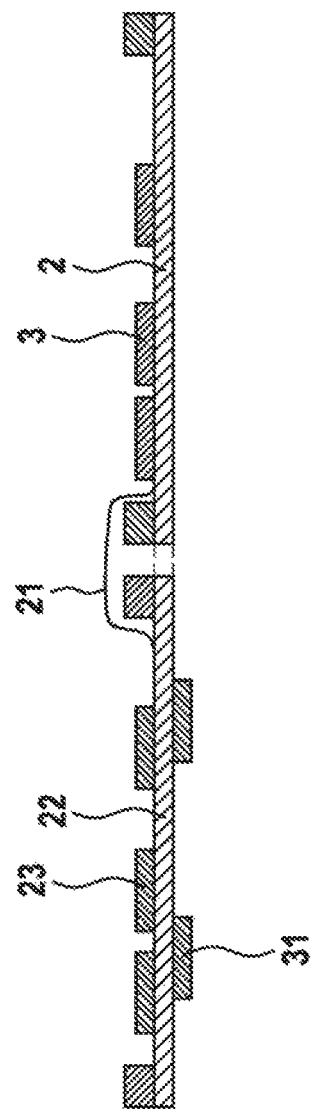
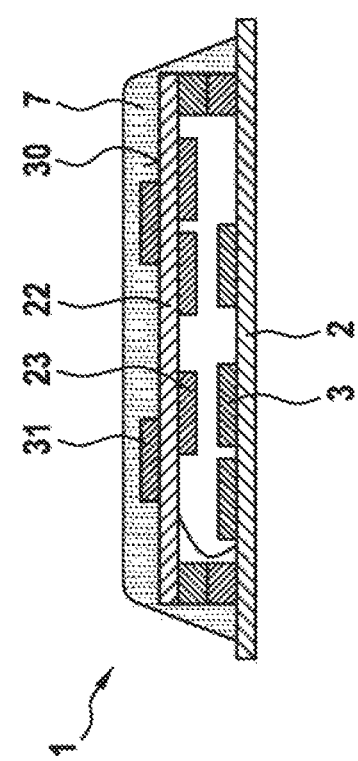

ELECTRONIC MODULE AND METHOD FOR PRODUCING AN ELECTRONIC MODULE HAVING A FLUID-TIGHT HOUSING

This application is a 35 U.S.C. § 371 National Stage Application of PCT/EP2016/075035, filed on Oct. 19, 2016, which claims the benefit of priority to Serial No. DE 10 2015 223 550.5, filed on Nov. 27, 2015 in Germany, the disclosures of which are incorporated herein by reference in their entirety.

FIELD OF THE INVENTION

The disclosure relates generally to electronic modules and to a method for producing an electronic module having a fluid-tight housing.

BACKGROUND

In automatic transmissions of a motor vehicle, there are transmission control modules for controlling the coupling and switching operations that are installed in the oil-filled interior space of the transmission. For the electronics, the transmission control modules generally have a fluid-tight housing of their own for the Transmission Control Unit (TCU), the power electronics and for example a circuit on leadframes (DBC, Direct Bonded Copper). The electronics are protected in the form of a thermoset molded housing or a steel housing or by means of a plastic cover with seals with respect to the rest of the transmission control module housing. In the case of flexible or rigid circuit boards, FPCs or PCBs, as the module construction and connection technology (packaging), these packagings have a cutout for the transmission control unit, in order that the transmission control unit can be adhesively attached in a heat-conducting manner on a carrier plate in this cutout or can be held down on it by a spring.

Transmission control units with steel housings generally have very complex pin lead-throughs in the form of glazed-in Ni—Fe pins and expensive housing parts. Furthermore, in terms of the geometry, the construction is very high, that is to say bulky, since the pins come out of the housing vertically instead of horizontally. On the other hand, the seal-tightness is very good. If required, the entire transmission control unit is subjected to what is known as a burn-in or high-low temperature test. The positioning and holding down of the TCU, transmission control unit, in the transmission takes place by means of a spring, in order that the transmission control unit is pressed against a cooling transmission component, such as for example a hydraulic plate, in a way that provides good heat conduction.

In the case of transmission control units that are encapsulated with a potting compound, known as molded TCUs, the circuit carrier (HDI-PCB, LTCC) must be adhesively attached onto a metal or ceramic plate and complex leadframe parts must be placed around the circuit carrier of the transmission control unit. Furthermore, bonding connections, that is to say electrically conducting connections, must be produced between the circuit carrier and this leadframe. This is followed by placing the transmission control unit in what is known as a molding tool for the encapsulation. After the encapsulation (molding), the leadframe must be punched free in the outlet from the molding compound, i.e. potting compound, in order that individual pins are created. The pins subsequently have to be laboriously cleaned and tin-coated.

The transmission control units (TCUs) with a plastic cover are sealed with respect to a flexible module film (FPC) by a sealing ring or an adhesive joint to intercept as far as possible at the edge of the cover any oil that may nevertheless penetrate. Because of potential problems with the seal-tightness between the cover and the FPC, or FPC or carrier plate, and to avoid a possible thermal pumping effect of an air space under the cover, the interior space of the cover and of the housing is laboriously filled with a gel.

In the case of integrated transmission control units potted with a potting compound, a bare-die circuit is completely potted with a potting compound of epoxy resin, polyester, polyurethane, etc. on an HDI-PCB, that is to say a rigid circuit board or an LTCC ceramic.

DE 10 2013 215 246 A1 describes an electronic module with circuit boards and a plastic sealing ring that can be molded on by injection molding, in particular for a motor vehicle transmission control unit, wherein a microstructuring is formed peripherally in the form of a ring in each case on the outer circumference of a first circuit board element and a corresponding peripheral microstructuring in the form of a ring is formed on the outwardly directed surface of the second circuit board element, which by means of a sealing ring produces a form-fitting connection both with the microstructuring formed on the first circuit board element and a form-fitting connection with the microstructuring formed on the second circuit board element.

SUMMARY

Embodiments of the present disclosure can advantageously make it possible to provide a simple, reliable, robust, fluid-tight electronic module and a method for producing a fluid-tight electronic module with reduced fixed costs.

According to a first aspect of the disclosure, it provides an electronic module, in particular for a transmission control module of a motor vehicle, which comprises a first circuit board with electronic components, spacers, which are arranged resting at least in corner regions of the first circuit board, a cover plate, wherein the cover plate is arranged on the spacers, and a potting compound, which as an end-face closure seals a gap produced by the spacers between the circuit board and the cover plate with respect to a housing for the electronic components arranged therein.

The electronic module according to the disclosure is distinguished in particular by the fact that the potting compound secures the cover plate on the circuit board in a material-bonding manner, wherein the coefficient of linear thermal expansion (CTE) of the potting compound coincides substantially with the coefficient of linear thermal expansion (CTE) of the circuit board and the cover plate. This yields several advantages. There is no need in the way described above for microstructures to be provided in the first and second circuit boards in order to produce a form-fitting housing by means of mechanical "interlocking". The forces of adhesion of the potting compound are sufficient to produce a material-bonding connection between the circuit board and the cover plate, and consequently to provide a housing in a fluid-tight manner. What is more, the stability and seal-tightness of the electronic module are retained under adverse thermal conditions and the formation of cracks is avoided.

According to an idea that develops the disclosure, the deviation of the coefficient of linear thermal expansion (CTE) between the CTE of the potting compound and the CTE of the circuit board and/or that of the cover plate is a maximum of 5-10 ppm/K. Consequently, the potting compound and the cover plate and the circuit board expand to the same extent under adverse thermal or mechanical conditions. Cracks are consequently avoided. A high degree of sealing is thereby ensured.

According to a further preferred embodiment, the potting compound has a coefficient of linear expansion (CTE) of about 20 ppm/K. It has surprisingly been found that a CTE of 20 is a good level between a high CTE, with little to very little fillers, and a low CTE, which is lowered by mineral fillers. Thermosets generally have a CTE of 60-70. The further the CTE is below a certain limit, for example below 20 ppm/K, the greater the fall in the strength of the potting compound.

In order to achieve a very good lifetime strength and lifetime seal-tightness, according to the disclosure the circuit board is formed with a CTE of about 18 ppm/K, wherein the cover plate is produced in particular from steel, depending on the alloy of Ni steels, with a CTE of between 11 and 20 ppm/K, more preferably from aluminum with a CTE of around 23 ppm/K, and particularly preferably from epoxy resin, with a CTE of around 20 ppm/K.

Instead of a metal cover, an epoxy resin plate, a plate for example produced from circuit board prepregs or circuit board cores that does not contain any circuitry wiring, may therefore be used as the cover plate. The number of prepregs or cores used depends on the required stiffness of the cover or the cover plate, which however could also be additionally adhesively attached in the middle for example.

In order to resist thermal and mechanical stresses, and thereby avoid cracks, the potting compound is an epoxy resin from the group of acid-anhydride-curing epoxies. This potting compound is acid-resistant and has very good resistance to higher temperatures and is also very easily obtainable with a CTE below 20 ppm/K.

According to a further idea of the disclosure, the potting compound is an epoxy resin from the group of amine-curing epoxies. The great advantage of amine-curing epoxies is that they are more benign in production with respect to health and the environment, since they produce lower harmful emissions.

For all these reasons, it has surprisingly been found that, as opposed to the form-fitting connection known from the prior art, a material-bonding connection is sufficient for forming a stable, fluid-tight housing. The solution of encapsulating the circuit board with its electronic components as a housing brings great advantages in comparison with a potting compound, that is to say molding bare-die electronic modules. Highly miniaturized bare-die electronics can be used, without having to be especially encapsulated. On account of the increasing miniaturization of microcomputers and memory chips, the requirements for direct protection with a molding and potting compound are becoming ever greater. The contact spacings for the bonding wires, soldering tin pins and solder balls, known as ball grids, are becoming ever smaller. On account of the diminishing spacings between two bonding wires, for example of 20 to 40 μm, the requirements for the mineral fillers of the molding/potting compounds, and consequently the costs, are increasing disproportionally. A compound with a filler size of 20 instead of 50 μm is therefore also more cost-intensive by a multiple. Furthermore, with miniaturization, a reduction in size of the silicon structures of the microcomputers and memories from 90 nm to 40 nm or 28 nm, there is an increase in the sensitivity to ions contained in the compounds and to alpha rays emitted by the fillers. With spacings of μm, larger fillers do not pass through and the compound is demixed here. Consequently, at the sensitive locations of the connection to the circuit carrier there is then a potting compound with scarcely any fillers. The material properties such as the coefficient of linear thermal expansion (CTE), strength, etc., change very considerably. On account of the creation of a housing, moreover, no tool costs for a potting compound or, for a molding tool, no tool costs for punching the pins are necessary. The overall height is reduced and there is no need for additional components and material for a housing. Furthermore, the fixed costs fall, so that the proportion of variable costs, that is to say the compound-dependent costs, increases. Consequently, free forms of the electronic module can be quickly created as desired, in any desired number. Furthermore, there is no problem of alpha rays, since no filler material is used here, but instead the bare-die electronics can be protected just by a coating or gel, which is inexpensive and, because of the fluid-tight housing, does not have to be fluid-resistant, in particular does not have to be oil-resistant.

According to an embodiment developing the disclosure, to make the electronic module even more compact, the cover plate is formed as a second circuit board with electronic components and the first and second circuit boards are connected to one another by means of a flexible cable, wherein in particular the second circuit board is populated on both sides with electronic components and the outer side of the second circuit board with electronic components is formed as enclosed by the potting compound. A circuit board populated on both sides allows the electronic module to be formed even more compactly. It goes without saying that the first circuit board may also be populated with electronic components on both sides.

In order to reduce the overall height and the weight, the potting compound is preferably formed as overlapping and the cover plate at the outer circumference, in particular the potting compound covers the entire cover plate or more preferably the potting compound is formed in an outer channel between the cover plate and the potting compound and spacers, forming a housing. There is a significant reduction in the amount of material required for the potting compound, in particular if the potting compound forms a sealing ring in an outer channel. This is important because the potting compound represents a major cost factor.

In order with a potting compound that is possibly very cost-intensive to provide an enclosed electronic module inexpensively, an alternative embodiment provides a spacer ring, which comprises the spacers and is formed as a continuous ring, shaped in particular in a rectangular profile, wherein the potting compound is only arranged in each case on opposite surfaces of the spacer ring between the circuit board and the cover plate, and this forms the end-face, sealing closure. Consequently, the requirement for the amount of potting compound is once again significantly less than in the exemplary embodiments previously described.

According to an embodiment developing the disclosure, the potting compound is arranged on a carrier plate and the first circuit board is arranged resting directly on the carrier plate, wherein in particular a cable is arranged lying on the outer upper side of the cover plate to an electronic add-on part of a third circuit board on the carrier plate. Consequently, for example, plug-in connectors or sensors, which are for example already sealed with respect to the fluid, may be connected to the electronic module in an electrically conducting manner by means of a cable or a flexible film. The overall space is thereby reduced small and the components can be produced inexpensively.

In order to produce an improved thermal resistance capability, according to an embodiment developing the disclosure the first circuit board is formed at a distance from the carrier plate, in particular by means of the potting compound as a carrier component, with an interspace and, in particular, the interspace is filled with a heat sink and/or a heat conducting film. The interspace consequently has the advantage of creating a thermal equalization, wherein a heat sink and/or a heat conducting film efficiently dissipate(s) the heat produced in the housing of the electronic module and discharge(s) it to the surroundings.

In order to make the cooling even more efficient, according to a further preferred embodiment the carrier plate has at least one clearance for receiving a heat sink or a component portion of a machine device that is controlled in particular by the electronic module.

It goes without saying that the first circuit board may likewise be formed with separate plug-in connectors and sensors outside the housing, in order to create a compact electronic module.

According to an embodiment developing the disclosure, in the case of a compact electronic module two separate two second circuit boards, which are separately sealed with a potting compound and form two enclosed fluid-tight housings, are arranged on the first circuit board. Consequently, a heat dissipation from two different housings may possibly be formed differently and an electronic module can be produced cost-efficiently with a number of housings, which have different functions and possibly different thermal loads.

According to an embodiment developing the disclosure, the spacers are arranged both on the first circuit board and the cover plate at complementary corner regions. Such an embodiment may be accompanied by production advantages in comparison with spacers which as one piece define the distance between the cover plate and the circuit board.

According to a further aspect of the disclosure, a method for producing an electronic module having a fluid-tight housing comprising the features described above is provided, wherein the method comprises providing a circuit board having electronic components, providing spacers at least in corner regions on the circuit board and providing a cover plate on the spacers for keeping the cover plate at a distance from the circuit board. The method is distinguished in particular by the fact that a potting compound is applied at the outer edges of the cover plate and on the circuit board, for the end-face sealing and material-bonding connection between the cover plate, the circuit board and the spacers to form a closed housing, and is cured, wherein the coefficient of linear thermal expansion (CTE) of the potting compound coincides substantially with the coefficient of linear thermal expansion (CTE) of the circuit board and the cover plate.

This provides an inexpensive production method that has low fixed costs, and the production costs are substantially the material costs and the variable production costs. The production costs are consequently more independent of the number of units and the geometry of the electronic module. Mounting is also easier. Furthermore, the curing of the potting compound at the same time offers a way of adjusting the temperature of the circuit as a pre-aging of the electronics (burn-in). While the temperature is being adjusted, the function can also be tested, and for example a high temperature test performed, at the same time and without additional expenditure. Additional heating for a test is no longer necessary, because it includes at the same time the final curing of the potting. A carrier plate is not necessarily required here, since for example a module packaging may also be mounted directly on a machine device, such as for example a transmission part.

Furthermore, simple electrical integration in a higher-level control module is easily performed. The electrical and electronic circuitry can be arranged on a circuit board, wherein this board may for example be bare-die-bonded or wire-bonded or soldered on a standard circuit board or what is known as an HDI-PCB, that is to say a High-Density Interconnect PCB. Packaged components, flip-chip components, ball grid array (BGA) components or wafer-level-package components on a PCB, HDI-PCB are possible. Gelling of the electronic circuitry, for example via bonded bare dies, can also be realized. There is also protection from alpha rays. It may be that a thin layer of coating is possible as protection on the components, or else as an underfilling in the case of BGA, wafer-level-package components with standard materials that do not have to be resistant to transmission oil. The circuit is fluid-tightly protected by means of the circuit board and the cover plate, wherein the potting compound as an epoxy resin compound is applied as a dam and the cover plate is placed on top. More preferably, the contact point of the cover plate with respect to the dam has possibly been provided in advance with a thin layer with the same epoxy resin, that is to say the potting compound, possibly of a higher viscosity, in order to achieve good wetting and in order to achieve the effect that, during the joining, epoxy resin is joined to epoxy resin.

The potting compound may also be applied to the entire cover surface of the cover plate as a thin highly viscous film as additional protection. During the crosslinking process, for example by baking out for 30 minutes at 140° C., the pressure in the interior space of the circuit is equalized by a venting hole, which is to be closed later, in order that the potting compound is not forced away by internal pressure.

It is pointed out that some of the possible features and advantages of the disclosure are described herein with reference to different embodiments. A person skilled in the art recognizes that the features can be combined, adapted or exchanged in a suitable way to arrive at further embodiments of the disclosure.

BRIEF DESCRIPTION OF THE DRAWINGS

Embodiments of the disclosure are described with reference to the accompanying drawings below, in which connection neither the drawings nor the description should be construed as restricting the disclosure. In the drawings:

FIG. 13 shows a cross-sectional view of a fourth embodiment according to the disclosure of the electronic module;

FIG. 14 shows a cross-sectional view of an alternative embodiment of the electronic module according to FIG. 13;

FIG. 15 shows a cross-sectional view of an alternative embodiment of the electronic module according to FIG. 13;

FIG. 16 shows a cross-sectional view of two individually populated circuit boards before assembly;

FIG. 19 shows a cross-sectional view of an alternative embodiment in relation to the preliminary stage shown in FIG. 17 in the method for producing the electronic module according to the disclosure;

FIG. 20 shows a cross-sectional view of the assembled electronic module analogous to FIG. 18;

FIG. 25 shows a cross-sectional view of two populated circuit boards according to an alternative embodiment in relation to FIGS. 1 and 16;

FIG. 26 shows a cross-sectional view of an assembled electronic module according to FIG. 18;

FIG. 27 shows a cross-sectional view of an assembled alternative electronic module according to FIG. 26;

FIG. 28 shows a cross-sectional view of an electronic module according to a further alternative embodiment;

FIG. 29 shows a cross-sectional view of two circuit boards according to an alternative embodiment corresponding to FIG. 16; and FIG. 30 shows a cross-sectional view of an assembled electronic module according to FIG. 23.

The figures are only schematically depicted and not true to scale. In the figures, the same designations denote features that are the same or have the same effect.

DETAILED DESCRIPTION

Figure 1:
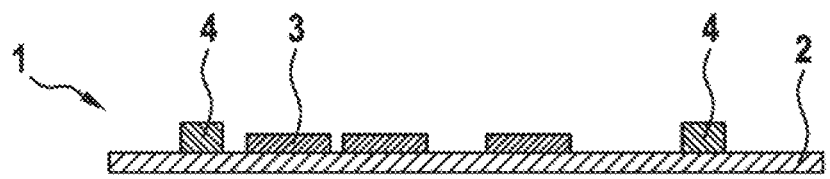
FIG. 1 shows a cross-sectional view according to a first not yet assembled embodiment of an electronic module.

FIG. 1 shows in cross section a first stage for the assembly of an electronic module 1 according to the disclosure or for the method for producing an electronic module 1 having a fluid-tight housing 26. This requires providing a circuit board 2, with copper conductor tracks arranged therein. Arranged on the circuit board 2 are electronic components 3. These components 3 may be SMD components, packaged components known as ICs with integrated circuits, but also bare-die electronic components. Since the silicon structures are not encapsulated with a molding compound, known as a potting compound, the silicon structures of the electronic components can be formed in a further miniaturized manner in a way corresponding to the present and future development, that is to say the spacings between the conductor tracks can fall from 90 nm to 40 or 28 nm and the contact spacings for bonding wires, soldering tin pins or ball grids can fall without additional costs from 50 μm to for example 20 μm. Furthermore, there are no risks caused by alpha rays, which conventionally occur due to mineral fillers in the potting compound.

Figure 2:
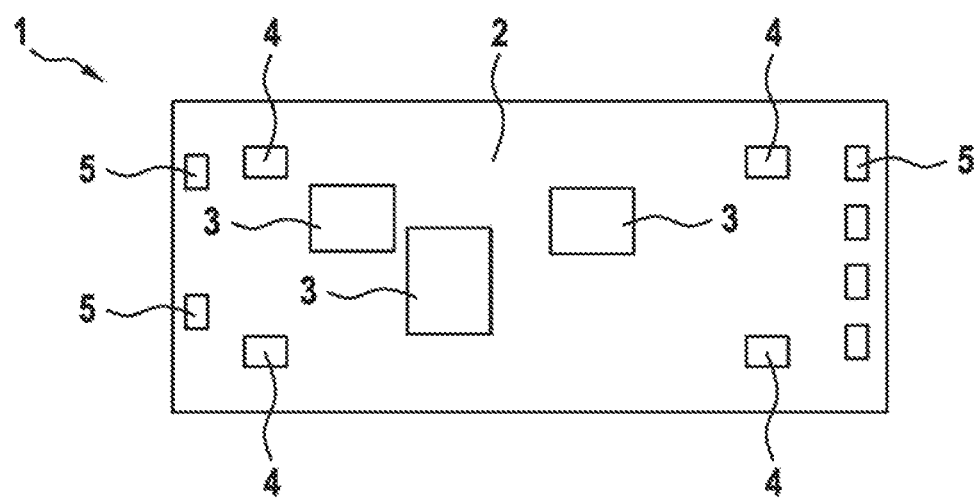
FIG. 2 shows a plan view of a not yet assembled electronic module.

FIG. 2 shows the state of the method from FIG. 1 in a plan view of the electronic module 1. In the corner regions, the four spacers 4 are arranged. In the rectangle defined by the spacers 4, the electronic components 3 are arranged. Parallel to the width of the circuit board 2, tin-coated copper contact areas 5, known as pads, are provided on the circuit board 2 for electrical connections. These copper contact areas 5 are terminals for plug-in connectors and other sensors or controllers. Since the copper contact plates 5 are tin-coated, they are aging-resistant with respect to fluids, in particular a transmission oil in which the electronic module 2 can be kept in particular.

Figure 3:
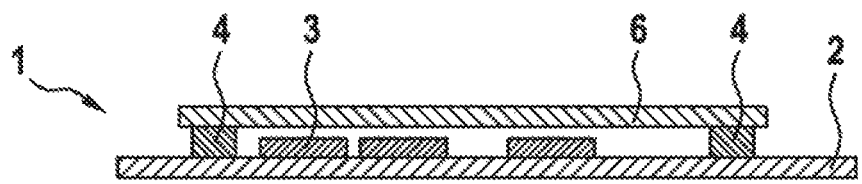
FIG. 3 shows a cross-sectional view of an electronic module with a cover plate.

FIG. 3 shows in a way corresponding to FIG. 1 the next method step, that of providing a cover plate 6 on the spacers 4 for keeping the cover plate at a distance from the circuit board 2 and for subsequently forming a housing 26.

Figure 4:
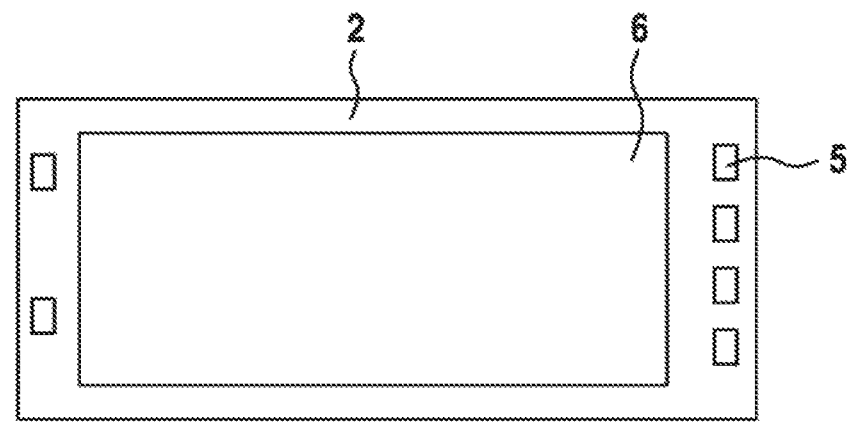
FIG. 4 shows a plan view of the figure shown in FIG. 3.

FIG. 4 shows in a way corresponding to FIG. 2 a plan view of FIG. 4, so that visibly formed in the plan view are only the circuit board 2 and, on both broad sides thereof, projecting beyond the cover plate 6, in each case the contact areas 5.

Figure 5:
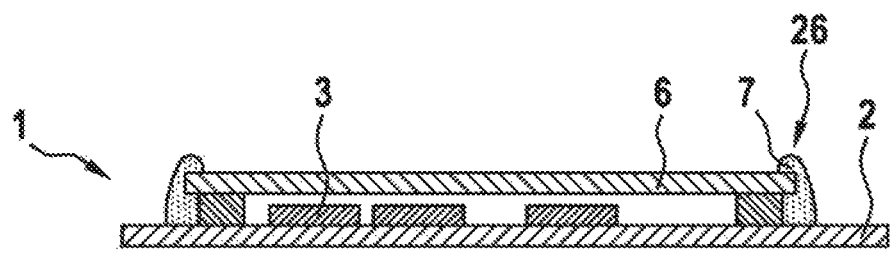
FIG. 5 shows a cross-sectional view of a first embodiment of the electronic module according to the disclosure.

FIG. 5 shows in a cross-sectional view the electronic module 1 according to the disclosure with a completed last method step corresponding to the method steps following in relation to FIGS. 1 and 3. The method steps for producing the electronic module 1 according to the disclosure from the state of FIG. 3 to FIG. 5 are the application of a potting compound 7 at the peripheral edge of the cover plate 6, so that a sealing dam is created as an end-face closure by the potting compound 7 between the circuit board 2 and the cover plate 6, which in a fluid-tight manner protects the electronic components 3 arranged therein in the form of a housing 26.

By contrast with the prior art according to DE 10 2013 215 246, it is no longer required to provide a peripheral microstructuring in both circuit board elements in order to create a form-fitting, interlocking connection.

According to the disclosure, it has surprisingly been found that the potting compound, preferably of a thermosetting polymer, in particular an epoxy resin, is sufficient to secure the cover plate in a material-bonding manner on the circuit board at a distance from it. It is important for this that the coefficient of linear thermal expansion (CTE) of the potting compound coincides substantially with the coefficient of linear thermal expansion (CTE) of the circuit board and the cover plate. There is therefore no longer any need for the laborious introduction of microstructurings, which were previously required for mechanical interlocking. Suitable choice of the potting compound 7 alone achieves the effect of producing a material-bonding adhesive behavior that also withstands thermal mechanical loads. The electronic module 1 is sometimes subjected to very high temperature fluctuations, which may lie in the range of −40 to 150° C. and more. Nevertheless, the formation of cracks is avoided, since according to the disclosure the coefficient of linear thermal expansion for the components forming the housing 26 substantially coincides. The coefficient of linear thermal expansion (CTE) may deviate between the CTE of the potting compound and the CTE of the circuit board and the CTE of the cover plate by a maximum in the range of 5-10 ppm/K to still achieve a sufficient temperature resistance.

As described in FIG. 16 et seq., preferably the cover plate 6 is a second circuit board. The potting compound has a coefficient of linear thermal expansion of about 20 ppm/K if it is an epoxy material filled with mineral fillers. A rigid circuit board has a coefficient of linear thermal expansion CTE of about 18 ppm/K. A cover plate 6 of aluminum, with a coefficient of linear thermal expansion of 23 ppm/K, would be lighter and rather less expensive, and still less expensive would be a cover plate 6 of a steel material with a coefficient of linear thermal expansion CTE of 11 to 20 ppm/K, depending on the alloy; if it contains greater proportions of Ni alloying components, even up to 20 ppm/K. If the cover plate 6 is an epoxy resin plate, it may be produced for example from circuit board prepregs or circuit board cores without circuitry wiring. The number of prepregs or cores used depends on the required stiffness of the cover plate 6, which however may also be additionally reinforced in the middle, for example with an additional adhesive attachment 8, as shown in FIG. 6.

Figure 6:
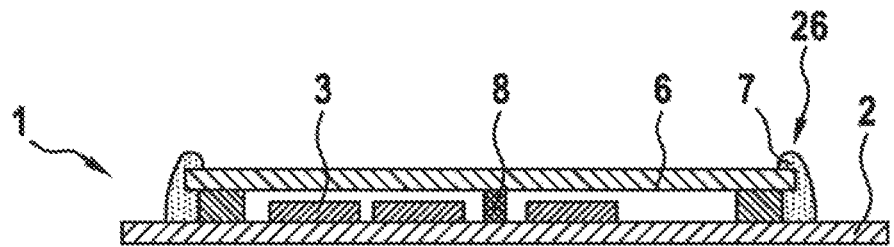
FIG. 6 shows a cross-sectional view of the electronic module according to the disclosure according to FIG. 5 with an additional reinforcement.

FIGS. 5 and 6 also show, seen in cross section, that the potting compound 7 reaches in an overlapping manner around the outer circumference of the cover plate 6. This is advantageous because, for example, an oil-containing fluid, for example in an automotive transmission, can penetrate into a circuit board 2 to a depth of about 0.5 mm. With an overlapping of the potting compound 7 as shown in FIGS. 5 and 6, deeper penetration at the outer circumference is consequently avoided.

On account of the creation of a fluid-tight housing 26, it is consequently possible to fix both packaged components and flip-chip, BGA or wafer-level packages or bare-die bonded or wire-bonded easily on the circuit board 2, without having to additionally take special precautions against the external fluid. Additional swarf protection devices are no longer necessary. Furthermore, in the case of such a housing 26, the fixed costs are extremely low, since the housing 26 is produced substantially from standard components. The costs incurred are substantially only variable costs, which are independent of the number of units, while the form of the housing 26 is freely definable. The representation in rectangles, as shown in FIGS. 1 to 6, in particular in the plan views of FIGS. 2, 4 and 8, serves only as a particularly preferred example.

Figure 7:
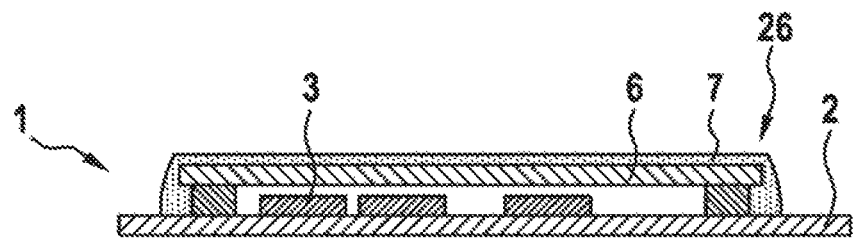
FIG. 7 shows a cross-sectional view of a second embodiment according to the disclosure of the electronic module.

FIG. 7 shows a further particular embodiment, in which the cover plate 6 is completely covered with the potting compound 7 over the entire outer surface area. This covering may be a relatively thin layer of about 0.2 mm. Consequently, penetration of for example an aggressive transmission oil is prevented even better. The epoxy resin potting compound 7 is very cost-intensive. For this reason, it is recommendable to use this resource sparingly.

Figure 8:
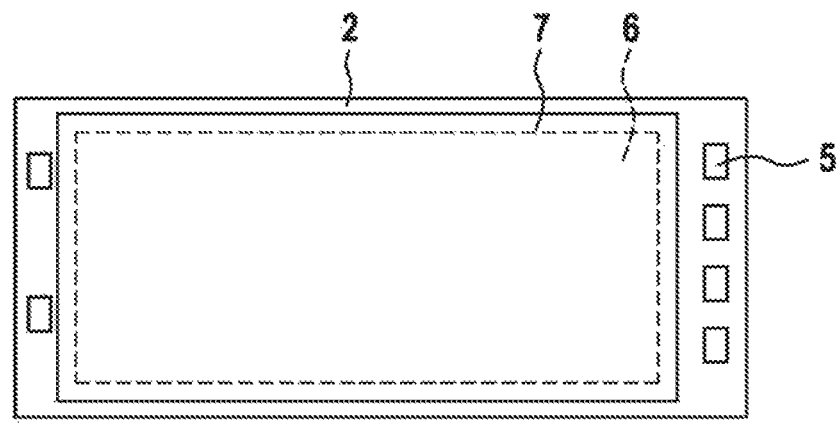
FIG. 8 shows a plan view of the electronic module according to the disclosure according to FIGS. 5 and 6.

FIG. 8 shows a plan view of FIGS. 5 and 6. The cover plate 6 has in its outer circumference the overlapping potting compound 7, and arranged on the broad sides of the rectangular circuit board 5 are the copper contact plates 5.

Figure 9:
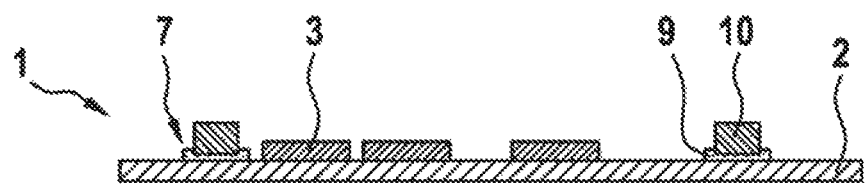
FIG. 9 shows a cross-sectional view of a third embodiment of a not yet assembled electronic module.

FIG. 9 shows, seen in cross section, a first method step for producing an electronic module 1 according to the disclosure having a fluid-tight housing 26, in the case of which the circuit board 2 has been provided. Electronic components 3 are already arranged on the circuit board 2.

Figure 10:
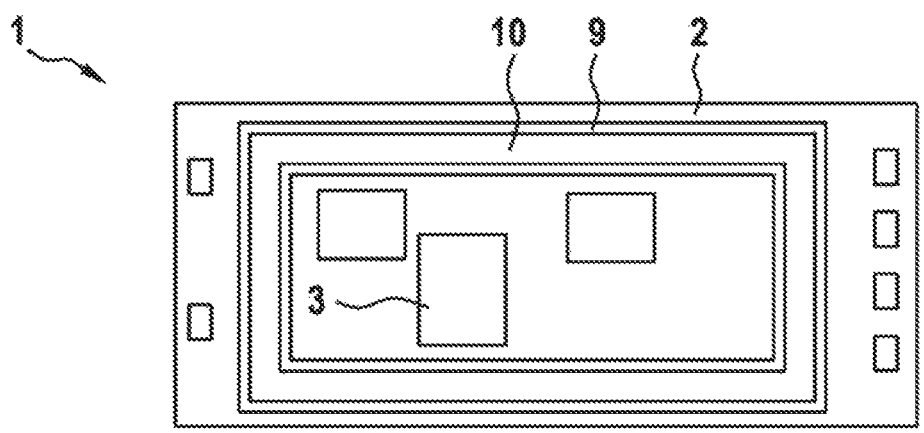
FIG. 10 shows a plan view of the electronic module according to FIG. 9.

In a rectangle, a bead 9 of the potting compound 7 is arranged in the form of a rectangle around the electronic components 3 on the circuit board 2, as shown in plan view in FIG. 10. Placed on the rectangular bead 9 of the potting compound 7 is a spacer ring 10, so that, by way of the bead 9 of the potting compound 7, the spacer ring 10 is adhesively bonded to the circuit board 2 in a fluid-tight manner by curing of the potting compound 7. It goes without saying that the bead 9 of the potting compound 7 may also comprise a film of potting compound if the electronic module 1 is to be produced in an extremely material-saving manner. The spacer ring 10 consequently comprises the spacers 4 described in the previous figures, and therefore replaces them.

Figure 11:
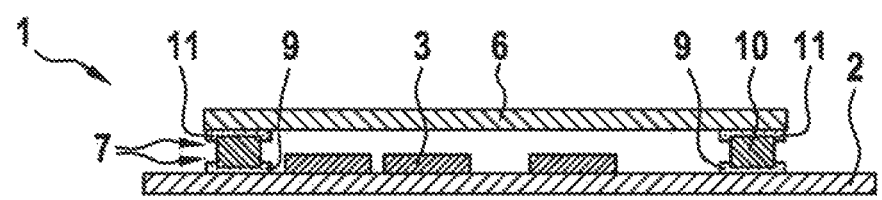
FIG. 11 shows a cross-sectional view of the finished-assembled electronic module according to FIG. 9.

As shown in FIG. 11, a bead 11 of the potting compound 7 has likewise been applied to the spacer ring 10, that is to say on the opposite surface, so that a fluid-tight adhesive bond between the upper side of the spacer ring 10 and the cover plate 6 is realized. Consequently, a sealing of the housing 26 has been created at the end faces as in the previously described FIGS. 1 to 8, a significantly smaller amount of potting compound 7 being necessary. Such embodiments are important because, by contrast with a spacer ring 10, the potting compound 7 is very cost-intensive. The spacer ring 10 preferably has a continuous rectangular profile, which as can be seen in FIG. 10 is in turn preferably formed in a rectangular shape in plan view. The cross sections of the spacer ring 10 are represented in FIGS. 9 and 11 and show there the rectangular profile of the spacer ring 10.

Figure 12:
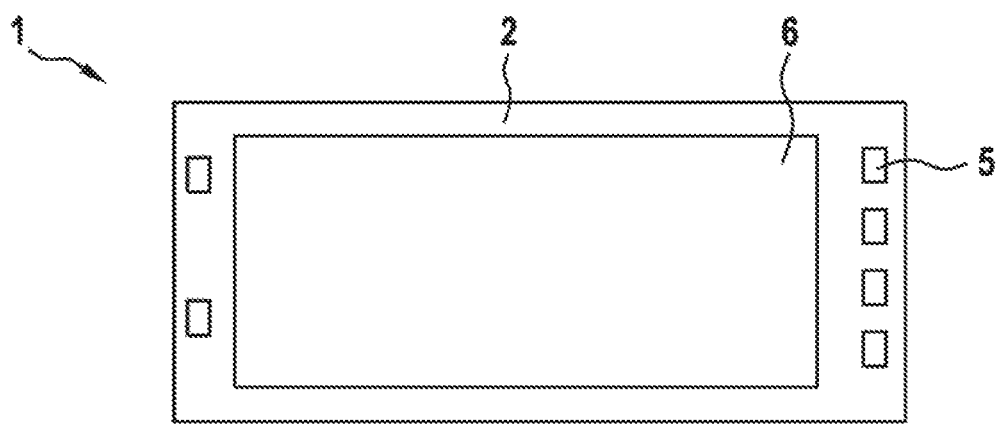
FIG. 12 shows a plan view of the electronic module shown in FIG. 11.

FIG. 12 is a view corresponding to FIG. 8, with a plan view of the finished-assembled electronic module 1 according to FIG. 11. Consequently, only the circuit board 2, the cover plate 6 and the copper contact plates 5 can be seen.

FIG. 13 shows a further particular embodiment of the electronic module 1 according to the disclosure. In the case of this electronic module 1, not only the control electronics are arranged on the circuit board 2, but additionally also sensors 12 and plug-in connectors 13. Consequently, the electronic module 1 is formed as an integrated electronic module. For this, the circuit board 2 is formed as enlarged, i.e. lengthened, so that on one side space is provided for sensors 12 and plug-in connectors 13 and on the other side the housing 26 is provided. Also provided, for example of plastic, is a carrier plate 14, on which the circuit board 2 with the electronic module 1 is arranged. The carrier plate 14 has a clearance 15, in particular in the region of the circuit board 2, where the components 3 are arranged on the upper side of the circuit board 2. Here, for example, a transmission housing component 16 reaches into the clearance 15 and consequently dissipates heat produced by the electronic components 3 by way of the circuit board 2 on the underside thereof directly to the transmission housing component 16. The carrier plate 14 bridges the distance from the circuit board 2 in the region of the arranged sensors 12 and the plug-in connectors 13. Much less heat is generated here.

FIG. 14 shows an alternative embodiment in relation to FIG. 13. In the case of this embodiment, the carrier plate 14 again has a clearance 15, wherein the clearance 15 is filled by a placed-in cooling base 17 as a heat sink. This has the advantage that the outer wall of the transmission housing component 16 does not have to have any special raised portion for the clearance 15. Rather, the transmission housing component 16 may be constructed uniformly with the same wall thickness in simple forms. The clearance 15 can consequently be designed individually with a corresponding cooling base 17.

FIG. 15 shows in cross section a further alternative embodiment in relation to FIG. 14. In the case of this embodiment, as a difference from FIG. 14, the circuit board 2 is formed in a divided manner. The circuit board 2 comprises the electronic module 1 with the electronic components 3 arranged on the upper side of the circuit board 2. A further circuit board 18, which comprises the sensors 12 and plug-in connectors 13, is arranged on the carrier plate 14. Electric cables 19, which are for example protected by a coating, or flexible cables connect the circuit board 2 to the circuit board 18 at electrical contacts 25, in order to create electrically conducting lines between the plug-in connector 13 and the sensors 12.

FIG. 16 shows, seen in cross-section in a way corresponding to FIG. 1, a further particular embodiment of the electronic module 1 according to the disclosure, in which there is provided in addition to the first circuit board 2 a further, second circuit board 22 with electrical components 23 and spacers 24 in the corner regions. FIG. 16 shows the electronic module 1 in the not yet assembled state corresponding to FIG. 1 in the cross-sectional view. The two circuit boards 2 and 22 may have been originally produced in one piece and be separated or broken or cut up in a further production step, or the two circuit boards 2, 22 are produced separately and then provided in one method step, as shown in FIG. 16. The two circuit boards 2, 22 are connected to one another by means of an electronic cable 21 or a flexible film, for example an FR4 flexible conductor, so that the electronic components 3, 23 can work with one another during operation. Consequently, the electronic module 1 can be produced in an extremely space-saving manner. There are no electrical contacts at the outer edge, and so there cannot be any risk of penetration of aggressive fluids, such as for example automatic transmission oil, and no damage can occur.

Figure 17:
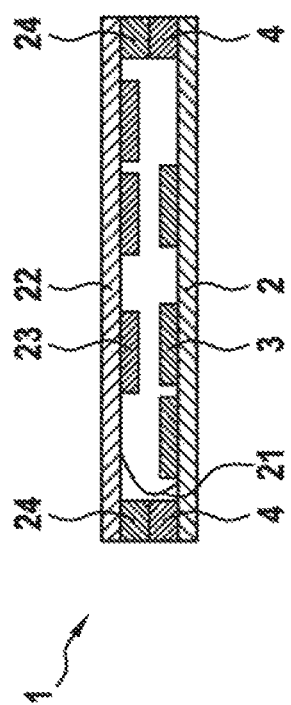
FIG. 17 shows a cross-sectional view in a following method step of the two circuit boards shown in FIG. 1.

FIG. 17 shows a further method step, following FIG. 16. In this method step, the first circuit board 2 is arranged lying as a base and the second circuit board 22, turned by 180° with respect to that in FIG. 16, is arranged resting on the first circuit board 2 on the spacers 4, 24 in the corner regions. The electrical components 3, 23 are consequently facing a housing interior. The housing interior is formed by the first circuit board 2 and the second circuit board 22 and also the potting compound 7, as shown in FIG. 18.

Figure 18:
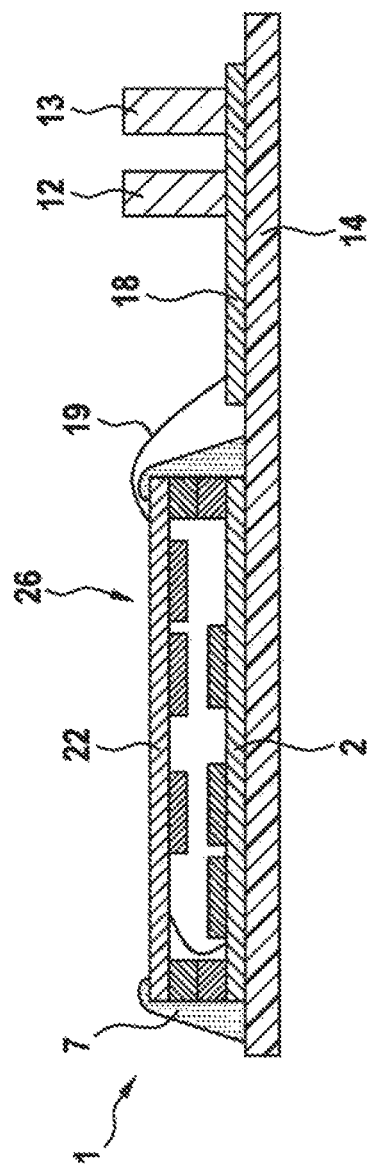
FIG. 18 shows a cross-sectional view in the assembled state of an electronic module according to the disclosure according to FIG. 16.

FIG. 18 shows a cross-sectional view corresponding to FIG. 15, with the difference that the electronic module 1 has been assembled to form a housing 26, as shown in the method steps in FIGS. 16 and 17 by way of preparation. Arranged separately on a carrier plate 14 is a third circuit board 18 for sensors 12 and plug-in connectors 13. The second circuit board 22 rests directly on the carrier plate 14 and the potting compound 7 connects both the first circuit board 2 to the second circuit board 22, reaching around the outer circumference, and the carrier plate 14. Since at least the two circuit boards 2, 22 and the potting compound 7 have a coefficient of linear thermal expansion (CTE) that substantially coincides in each case, no cracks occur as a result of thermal loads. A material-bonding connection is sufficient, and an additional interlocking on the basis of a form fit is consequently no longer necessary, that is to say that according to the disclosure there is no need for complex pre-working of the circuit boards 2, 22 and the carrier plate 14.

FIG. 19 shows a cross-sectional view corresponding to FIG. 17 of the electronic module 1 in production, with the only difference that a heat conducting film 25 or thermal paste has been applied under the electrical circuit board 2. Consequently, in a way comparable to FIG. 15, instead of a cooling base 17 the first circuit board 2 is raised with respect to the carrier plate 14, the distance of the first circuit board 2 from the carrier plate 14 being maintained as a gap by the potting compound 7, as shown in FIG. 20.

Figure 21:
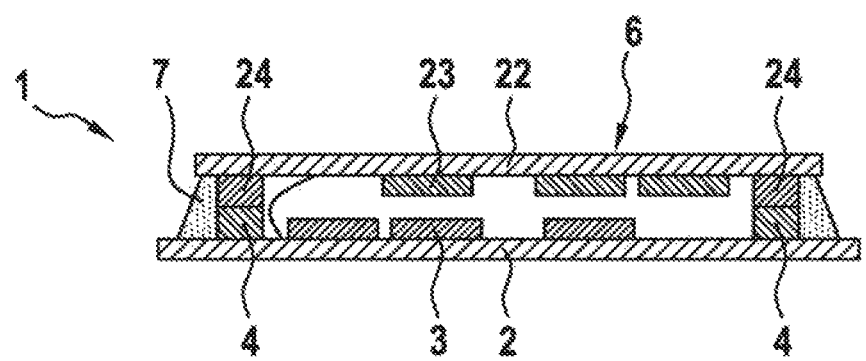
FIG. 21 shows a cross-sectional view of an alternative embodiment in relation to FIGS. 3 and 5.

FIG. 21 shows an alternative embodiment of the electronic module 1 according to the disclosure in relation to the previously described embodiments of FIGS. 1 to 20. In the case of this embodiment, the potting compound 7 is used extremely sparingly. Seen in cross section, the potting compound 7 is only applied and cured in a channel between the first circuit board 2 and the second circuit board 22 as a cover plate 6 and the spacers 24, 4. The potting compound 7 consequently does not cover the outer circumferential edge of the cover plate 6 or of the second circuit board 22. Only the end faces of the housing 26 created by the circuit boards 2, 22 of the electronic module 1 are filled by means of the potting compound 7. The material-bonding forces of adhesion of the potting compound 7 with the first circuit board 2 and the second circuit board 22 are sufficient for securing the housing 26 in a fluid-protected manner. As previously described, the electronic components 3, 23 can be produced with high microstructure resolutions with respect to wire and conductor track spacings and do not, or no longer, have to be additionally protected from an aggressive fluid medium.

Figure 22:
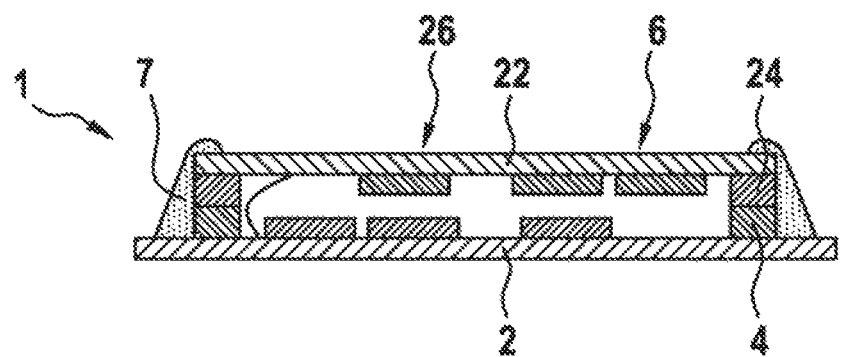
FIG. 22 shows a cross-sectional view of an alternative embodiment in relation to FIG. 6.

FIG. 22 on the other hand shows an embodiment corresponding to FIG. 18 in which it is just that the first circuit board 2 has a larger surface area than the second circuit board 22, the spacers 4, 24 being arranged as protruding with respect to the second circuit board 22 as a step in the outer circumference and being sealed by the potting compound 7 in relation to a smooth exterior outer circumference. Here, too, as shown in FIGS. 18, 20, 5, 6, 7, 13, 14 and 15, the potting compound 7 again reaches around the outer circumferential edge of the second circuit board 22, which acts as a cover plate 6.

Figure 23:
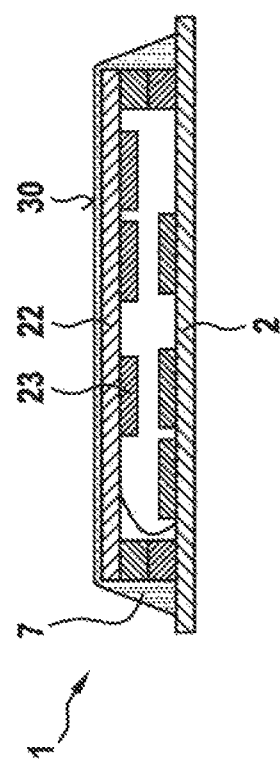
FIG. 23 shows a cross-sectional view of an alternative embodiment in relation to FIG. 7.

FIG. 23 shows a further particular embodiment of the electronic module 1 according to the disclosure. In the case of this electronic module 1, the potting compound 7 extends over the entire surface of the cover plate 6, which is formed here in this case as a second circuit board 22. This has the advantage that terminal pins passing through the circuit board 22 on the upper side of electronic components 23 arranged on the underside are sealed with respect to fluids. The outer layer thickness of the potting compound 7 on the second circuit board 22 can be minimal in a resource-sparing manner. According to the wherein, it has been found that layer thicknesses of 0.2 mm are sufficient.

Figure 24:
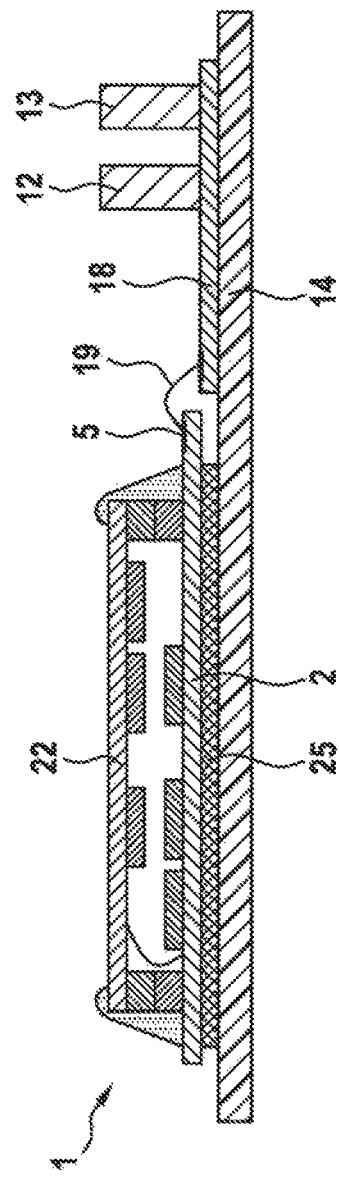
FIG. 24 shows an alternative embodiment of the electronic module in cross section.

FIG. 24 shows a further particular embodiment corresponding to FIGS. 20 and 22. Here, therefore, the embodiments of FIGS. 22 and 20 are combined with one another. As represented in FIG. 22, the first circuit board 2 is formed with a larger base area than the second circuit board 22 and, as shown in FIG. 22, is placed as an electronic module 1 on a heat conducting film 25 or heat conducting paste 25, which in turn is arranged on the carrier plate 14. The third circuit board 18 with the plug-in connector 13 and the sensors 12 are arranged separately on the carrier plate 14. By means of the cable 19, electrical lines on the contact plates 5 are connected in an electrically conducting manner.

FIG. 25 shows a cross-sectional view corresponding to FIGS. 16 and 13 before a potting compound 7 has been applied and cured as an end-face closure for forming a fluid-tight housing 26, as shown in FIG. 26. Here, as shown in FIG. 13, the circuit board 2 is arranged over a large area, the second circuit board 22, acting as a cover 6, having a smaller working area. By means of a flexible cable film, the two circuit boards 2, 22 are connected to one another in an electrically conducting manner.

FIG. 26 shows, seen in cross section, the assembled electronic module 1, the second circuit board 22 being mounted on a carrier plate 14 as represented in the previous figures. Outside the housing, the plug-in connector 13 and sensors 12 are arranged on the first circuit board 2.

FIG. 27 shows a further particular embodiment, which develops the embodiment of FIG. 26. Here, by contrast with FIG. 26, two separate housings 26, 36 are arranged, both housings 26, 36 having the first circuit board 2 as a common base plate, with in each case electronic components 3 on the upper side thereof. The first housing 26 has as a cover plate 6 the second circuit board 22 with electronic components 23 and the second housing 36 has as a cover plate 6 a fourth circuit board 32 with electronic components 33 on the underside thereof. The components 3, 23 of the first housing 26 produce a greater amount of heat than the electronic components 3, 33 of the second housing 36. For this reason, arranged under the housing 26 of the circuit board 2 is a heat conducting film 25, and following that an additional cooling base 17, which in turn is arranged on a carrier plate 14 or a transmission housing component 16 or a housing component 16. A plastic spacer plate 28 is arranged under the second housing 36.

FIG. 28 shows a further particular embodiment of FIG. 26 corresponding to FIG. 24. In the case of this embodiment, the first circuit board 2 is arranged on a heat conducting film 25, as shown in FIG. 24, the distance being maintained as a gap by means of the potting compound 7, as represented in FIG. 20. In addition, here the portion of the circuit board 2 is also arranged at a distance from the carrier plate or a housing component by a potting compound 27, here too the heat conducting film 25 being arranged lying in between in this region. For reinforcement, an intermediate holder 29 is arranged in the middle on the underside of the circuit board 2, as an extension of the potting compound 7 and the spacers 4, 24.

FIG. 29 shows in a way corresponding to FIG. 25 and FIG. 1 the first circuit board 2 and a second circuit board 22, either separated from the first as a result of a separating operation or a separately produced circuit board 22, with the difference that the second circuit board 22 not only has electronic components 23 on the underside but also has electronic components 31 arranged on the upper side thereof. In the aforementioned figures shown, the two circuit boards 2, 22 are connected to one another by means of a flexible conductor cable 21.

FIG. 30 shows the assembled state of the electronic module 1, of the prepared electronic module 1 represented in FIG. 29. This electronic module 1 according to FIG. 30 shows the special feature that the potting compound 7 also completely covers over the outer surface side 30 of the second circuit board 22 as well as the electronic components 31 on the outer side of the second circuit board 22. In the case of FIG. 30, the potting compound 7 is shown in an exaggerated state with respect to the covering. For reasons of making sparing use of the material for the potting compound 7, it is possibly sufficient to form a very thin film over the surface 30 and the electronic components 31, of the order of magnitude of a few millimeters or tenths of a millimeter.

Finally, it should be pointed out that terms such as "having", "comprising" etc. do not exclude other elements or steps and terms such as "a" or "one" do not exclude more than one. Designations in the claims should not be regarded as restrictive.

The invention claimed is:

1. An electronic module, comprising
a first circuit board including electronic components;
spacers arranged so as to be resting at least in corner regions of the first circuit board;
a cover plate positioned on the spacers;
a potting compound acting as an end-face closure that seals a gap produced by the spacers between the first circuit board and the cover plate so as to form a housing, wherein:
the electronic components are positioned within the housing;
the potting compound secures the cover plate on the first circuit board in a material-bonding manner; and
a coefficient of linear thermal expansion of the potting compound coincides substantially with a coefficient of linear thermal expansion of the first circuit board and of the cover plate; and
a carrier plate, wherein the first circuit board is positioned at a distance from the carrier plate as a carrier component, with an interspace therebetween, and the potting compound spaces the first circuit board apart from the carrier plate.

2. The electronic module as claimed in claim 1, wherein a deviation of the coefficient of linear thermal expansion between the potting compound, the first circuit board and the cover plate is a maximum of 5-10 ppm/K.

3. The electronic module as claimed in claim 1, wherein the potting compound has a coefficient of linear thermal expansion of about 20 ppm/K.

4. The electronic module as claimed in claim 3, wherein:
the first circuit board has a coefficient of linear thermal expansion of about 18 ppm/K; and
the cover plate is formed from steel, and has a coefficient of linear thermal expansion of between 11 and 20 ppm/K depending on an Ni alloy of the steel.

5. The electronic module as claimed in claim 3, wherein:
the first circuit board has a coefficient of linear thermal expansion of about 18 ppm/K; and
the cover plate is formed from aluminium, and has a coefficient of linear thermal expansion of around 23 ppm/K.

6. The electronic module as claimed in claim 3, wherein:
the first circuit board has a coefficient of linear thermal expansion of about 18 ppm/K; and
the cover plate is formed from epoxy resin, and has a coefficient of linear thermal expansion of around 20 ppm/K.

7. The electronic module as claimed in claim 1, wherein the potting compound includes an epoxy resin from the group of amine-curing epoxies.

8. The electronic module as claimed in claim 1, further comprising:
a flexible cable, wherein:
the cover plate is a second circuit board that includes further electronic components; and
the first and second circuit boards are connected to each other via the flexible cable.

9. The electronic module as claimed in claim 1, wherein the potting compound overlaps an outer circumference of the cover plate, or the potting compound is formed in an outer channel between the first circuit board, the cover plate and the spacers, so as to form the housing.

10. The electronic module as claimed in claim 9, wherein the potting compound covers an entirety of the cover plate.

11. The electronic module as claimed in claim 10, further comprising:
a flexible cable, wherein:
the cover plate is a second circuit board that includes further electronic components both on a side facing the first circuit board and on side facing away from the first circuit board; and
the first and second circuit boards are connected to each other via the flexible cable.

12. The electronic module as claimed in claim 1, wherein:
the spacers form a continuous spacer ring; and the potting compound forms the end-face, so as to seal closed opposite surfaces of the spacer ring between the first circuit board and the cover plate.

13. The electronic module as claimed in claim 12, wherein the continuous spacer ring has a rectangular profile shape.

14. The electronic module as claimed in claim 1, the electronic module further comprises:
    a third circuit board positioned on the carrier plate, and including an electronic add-on part; and
    a cable is lying on an outer upper side of the cover plate and connected to the electronic add-on part.

15. The electronic module as claimed in claim 14, wherein the carrier plate has at least one clearance configured to receive a heat sink or a component portion of a machine device that is controlled by the electronic module.

16. The electronic module as claimed in claim 1, wherein the first circuit board further includes separate plug-in connectors and sensors positioned outside the housing; and
    the spacers are distributed both on the first circuit board and on the cover plate at complementary corner regions.

17. The electronic module of claim 1, further comprising at last one of a heat sink and a heat conducting film that fills in the interspace.

18. A method of producing an electronic module with a fluid-tight housing, the method comprising:
    positioning spacers at least in corner regions on a circuit board that includes electronic components;
    positioning a cover plate on the spacers so as to keep the cover plate at a distance from the circuit board;
    applying and curing a potting compound at outer edges of the cover plate and on the circuit board so as to form an end-face sealing closure that seals a gap produced by the spacers between the first circuit board and the cover plate and so as to form a material-bonding connection between the cover plate, the circuit board and the spacers to form a closed housing, wherein the electronic components are positioned within the housing, and wherein a coefficient of linear thermal expansion of the potting compound coincides substantially with a coefficient of linear thermal expansion of the circuit board and of the cover plate; and
    positioning the first circuit board at a distance from the carrier plate as a carrier component, with an interspace therebetween, wherein the potting compound spaces the first circuit board apart from the carrier plate.

19. An electronic module, comprising
    a first circuit board including electronic components;
    spacers arranged so as to be resting at least in corner regions of the first circuit board;
    a cover plate positioned on the spacers;
    a potting compound acting as an end-face closure that seals a gap produced by the spacers between the first circuit board and the cover plate so as to form a housing, wherein:
        the electronic components are positioned within the housing;
        the potting compound secures the cover plate on the first circuit board in a material-bonding manner; and
    a coefficient of linear thermal expansion of the potting compound coincides substantially with a coefficient of linear thermal expansion of the first circuit board and of the cover plate, wherein
    the first circuit board further includes separate plug-in connectors and sensors positioned outside the housing; and
    the spacers are distributed both on the first circuit board and on the cover plate at complementary corner regions.

20. The electronic module as claimed in claim 19, further comprising:
    a flexible cable, wherein:
        the cover plate is a second circuit board that includes further electronic components both on a side facing the first circuit board and on side facing away from the first circuit board; and
    the first and second circuit boards are connected to each other via the flexible cable.

* * * * *

UNITED STATES PATENT AND TRADEMARK OFFICE
CERTIFICATE OF CORRECTION

PATENT NO. : 10,462,915 B2
APPLICATION NO. : 15/779254
DATED : October 29, 2019
INVENTOR(S) : Uwe Liskow Page 1 of 1

It is certified that error appears in the above-identified patent and that said Letters Patent is hereby corrected as shown below:

In the Claims

In Claim 14, at Column 15, Lines 6-7, insert the word --wherein-- between the "," and the word "the".

Signed and Sealed this
Eleventh Day of February, 2020

Andrei Iancu
*Director of the United States Patent and Trademark Office*